United States Patent [19]

Irwin et al.

[11] Patent Number: 5,627,850

[45] Date of Patent: May 6, 1997

[54] LASER DIODE ARRAY

[75] Inventors: Timothy L. Irwin, Rochester; Michael J. Cook, Lansing; Kirk S. Mellen, Baldwinsville; Robert J. Kolbet, Penfield, all of N.Y.

[73] Assignee: Paradigm Lasers, Inc., East Rochester, N.Y.

[21] Appl. No.: 407,446

[22] Filed: Mar. 20, 1995

[51] Int. Cl.$^6$ .................................................... H01S 3/19
[52] U.S. Cl. .................. 372/43; 372/34; 372/50; 372/75; 372/36; 257/88; 257/714
[58] Field of Search .................. 372/34–36, 43, 372/44, 50, 75; 257/88, 99, 714

[56] References Cited

U.S. PATENT DOCUMENTS

| 3,683,296 | 8/1972 | Scalise | 372/75 |
|---|---|---|---|
| 4,409,278 | 10/1983 | Jochym | 428/163 |
| 4,881,237 | 11/1989 | Donnelly | 372/34 |
| 5,040,187 | 8/1991 | Karpinski | 372/34 |
| 5,105,430 | 4/1992 | Mundinger et al. | 372/35 |
| 5,128,951 | 7/1992 | Karpinski | 372/50 |
| 5,216,688 | 6/1993 | Kortz et al. | 372/75 |
| 5,291,504 | 3/1994 | Bournes | 372/75 |

FOREIGN PATENT DOCUMENTS 2542652  7/1977  Germany ................ 372/66

*Primary Examiner*—Rodney B. Bovernick
*Assistant Examiner*—Yisun Song
*Attorney, Agent, or Firm*—Robert J. Bird

[57] ABSTRACT

A laser diode array includes a dielectric block with a "direct bonded" conductor layer. The conductor layer is segmented by diode bar spaces cut through it, and a laser diode bar is positioned in each space. Current through the conductor layer energizes the laser diode bars. In one form, the laser diode array and the conductor layer form a conductor ring surrounding a laser medium which is energized by the laser diode bars. In another form, a coolant flow tube within the conductor ring forms an annular coolant channel around the enclosed laser medium. In still another form, the conductor ring is itself surrounded by coolant channels.

10 Claims, 3 Drawing Sheets

▨ Cu  ▩ BeO

LASER DIODE ARRAY

BACKGROUND OF THE INVENTION

1. Technical Field

This invention relates to laser excitation by an adjacent or surrounding array of laser diodes, and to the structure and configuration of the array.

2. Background Information and Disclosure under 37 CFR 1.97–1.99

Excitation of a laser from an adjacent or surrounding array of laser diodes is known in the prior art.

U.S. Pat. No. 5,033,058 to Cabaret et al, issued Jul. 16, 1991, discloses a laser rod in a glass tube with a segmented reflective coating. Laser diodes placed around the glass tube emit through windows in the reflective coating to excite the laser rod.

U.S. Pat. No. 5,040,187 to Karpinski, issued Aug. 13, 1991 and U.S. Pat. No. 5,128,951 to Karpinski, issued Jul. 7, 1992 disclose flat laser diode arrays mounted in a ceramic substrate with a metallized surface. Current through the metallized surface energizes the laser diodes, which then excite an adjacent laser medium, not shown in the patents.

Related subject matter is also disclosed in a copending patent application Ser. No. 08/325,513, filed Feb. 1, 1995 and commonly assigned herewith. That copending patent application, now U.S. Pat. No. 5,521,936, issued May 28, 1996, discloses a radial array of laser diodes mounted in a segmented conductive ring surrounding a laser rod. An inner tube forms a coolant channel around the laser rod, and an outer sleeve forms a coolant channel around the ring and the laser diodes.

SUMMARY OF THE INVENTION

A laser diode array according to this invention includes a dielectric block with a "direct bonded" conductor layer. The conductor layer is segmented by diode bar spaces cut through it, and a laser diode bar is positioned in each space. Current through the conductor layer energizes the laser diode bars.

In one form, the laser diode array and the conductor layer form a conductor ring surrounding a laser medium which is energized by the laser diode bars. In another form, a coolant flow tube within the conductor ring forms an annular coolant channel around the enclosed laser medium. In still another form, the conductor ring is itself surrounded by coolant channels.

DRAWING

FIGS. 1–4 are cross-sectional views of various stages of construction of a laser and diode array in one form of this invention.

FIG. 5, similar to FIG. 3, shows a laser and diode array in a second form of this invention.

DESCRIPTION OF PREFERRED EMBODIMENTS

Figure 1:
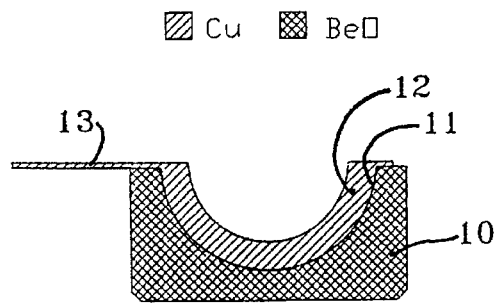

In FIG. 1, a block 10 of a dielectric material such as beryllium oxide (BeO) includes a semi-cylindrical cavity 11. The cavity 11 is lined with a semi-cylindrical conductor 12 which is "direct bonded" to the block 10. The conductor 12 includes an electrode 13 extending out from the block 10. For clarity, FIG. 1 shows only one block 10, conductor 12, and electrode 13. The conductor 12 is preferably copper and the block 10 is preferably beryllium oxide.

Direct bonding of the conductor 12 in the block 10 is a key feature of this invention. Direct bonding or "direct bond copper" is a substrate metallization technology that bonds copper to a ceramic substrate without an intermediate layer of bonding material. The technique is beneficial here because it forms a strong and reliable bond, and especially because it does not impair thermal conductivity of the conjoined materials at their interface. The direct bond is formed in a nitrogen atmosphere at a temperature of about 1070° C. The copper is first oxidized, then placed on the substrate and into a furnace for firing.

Figure 2:
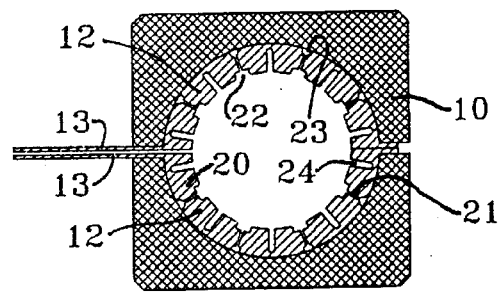

In FIG. 2, a pair of blocks 10 are joined together. The semi-cylindrical conductors 12 together form a conductor ring 20. The conductor ring 20 includes a number of radial diode bar spaces 21 cut through it, dividing the ring into a plurality of ring segments. Each diode bar space 21 includes an expanded inner end 22 and outer end 23, and radial stress relief grooves 24 between bar spaces 21. The electrodes 13 and their respective connections to the conductor ring 20 are electrically separate.

Figure 3:
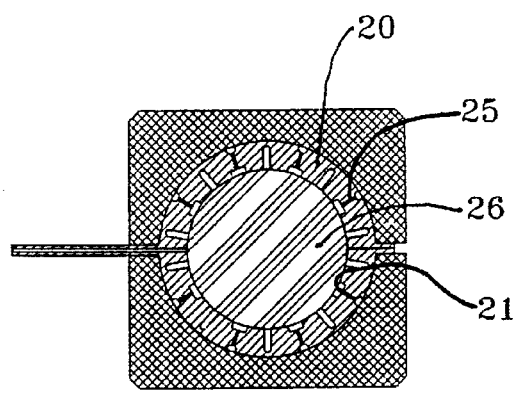

FIG. 3 shows a laser diode bar 25 mounted in each space 21, and a laser rod 26 mounted in the conductor ring 20. The laser diode bars 25 are fixed in the bar spaces 21 by solder. The ring segments and the laser diode bars 25 soldered between them together form a current path from electrode to electrode around the conductor ring 20.

Figure 4:
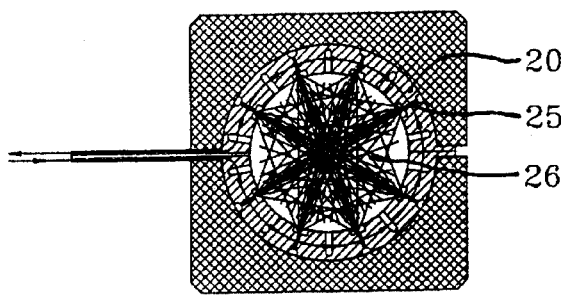

FIG. 4 shows the device of FIG. 3 in operation. Electric current from electrode to electrode, around the conductor ring 20 and the laser diodes 25 mounted in it as indicated by the arrows around the ring, energizes the laser diodes 25 which in turn energize the laser rod 26. FIG. 4 shows the symmetry of pumping action produced by the radial array of laser diodes.

Figure 5:
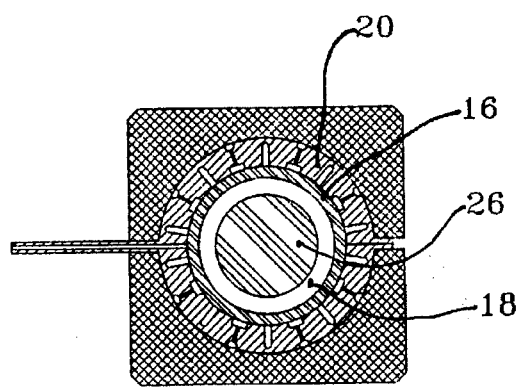

FIG. 5, corresponding to FIG. 3, shows a modified form of this device in which a dielectric coolant flow tube 16 is fit into the conductor ring 20. A laser rod 26 is mounted and centered within the coolant tube 16 by suitable spacers, not shown, the rod and tube together forming an annular rod coolant channel 18 around the laser rod 26. The coolant channel 18 is a conduit for coolant water to carry heat away from the laser rod 26. This is particularly important for continuous laser operation. The structure of the device of FIG. 5 is otherwise the same as that of FIG. 3.

Figure 6:
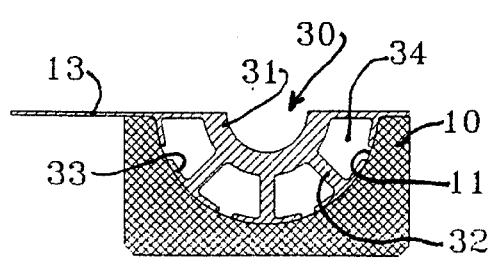
FIGS. 6–9 show a laser and diode array in a third form of this invention.

FIGS. 6–9 show another modified form of this device. In FIG. 6, the block 10 and semi-cylindrical cavity 11 are the same as in FIG. 1. A semi-cylindrical conductor member 30 includes a central half ring 31 and a plurality of radial webs 32, each of these webs in turn including an arcuate flange 33 at its outer end. Collectively, the flanges 33 substantially form a semi-cylinder, and they are direct bonded to the block 10. The half ring 31, the several radial webs 32, and the flanges 33 bonded to the block 10, together form a number of coolant flow channels 34. The conductor member 30 includes an electrode 13 extending out from the block 10.

Figure 7:
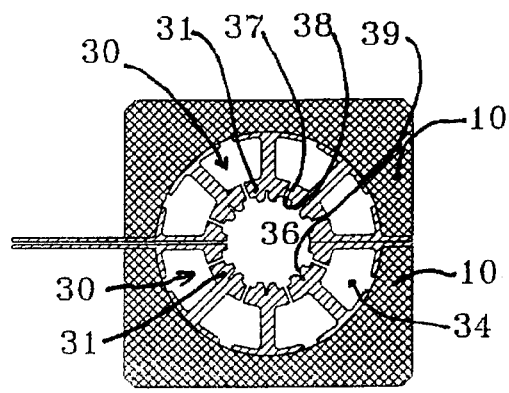

In FIG. 7, a pair of blocks 10 are joined together. The central half rings 31 of the semi-cylindrical conductor members 30 together form a central conductor ring 36 surrounded by the coolant channels 34. The conductor ring 36 includes a number of radial diode bar spaces 37 cut through it, each including an expanded inner end 38, and radial stress relief grooves 39 between bar spaces 37. The electrodes 13 and their connections to their respective conductor members 30 are electrically separate.

Figure 8:
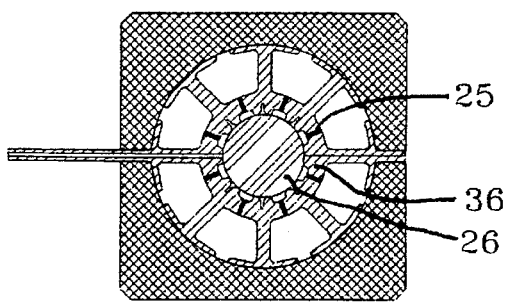

FIG. 8 shows a laser diode bar 25 mounted in each bar space 37, and a laser rod 26 mounted in the central conductor ring 36.

Figure 9:
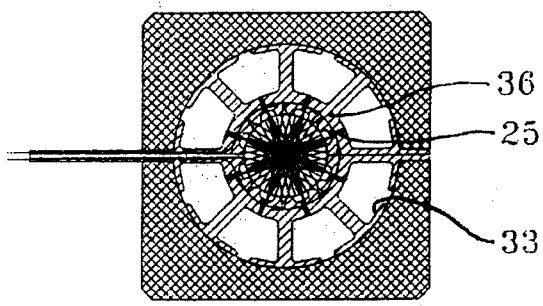

FIG. 9 shows the device of FIG. 8 in operation. Electric current from electrode to electrode, around the conductor ring 36 and the laser diodes 25 mounted in it as indicated by the arrows around the ring, energizes the laser diodes 25 which in turn energize the laser rod 26. Adjacent flanges 33 do not make contact and are not part of the electrical circuit path. FIG. 9 shows the symmetry of pumping action produced by the radial array of laser diodes.

Figure 10:
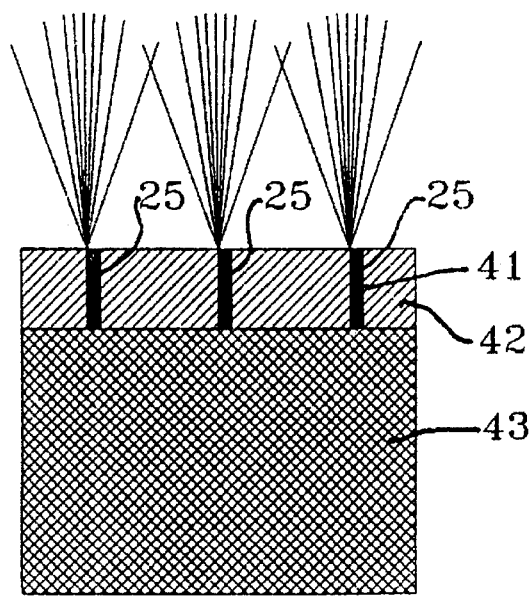
FIG. 10 is a cross-sectional view of a planar laser diode array.

FIG. 10 shows a plurality of laser diode bars 25 in a planar array in parallel bar spaces 41 in a flat conductor layer 42. The conductor layer 42 is direct bonded on a flat dielectric substrate or block 43. The conductor layer 42 is preferably copper. The substrate 43 is preferably beryllium oxide.

Figure 11:
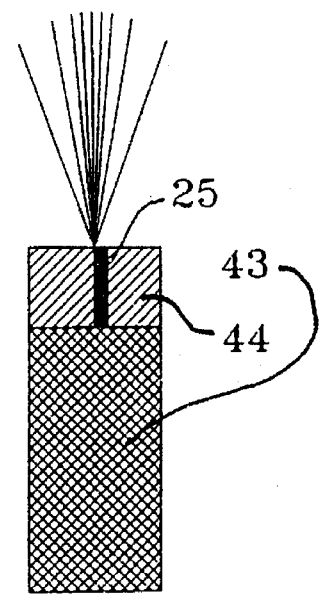
FIGS. 11–13 are similar views of individual laser diodes.
Figure 12:
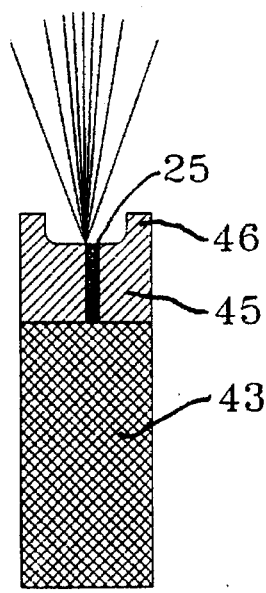
Figure 13:
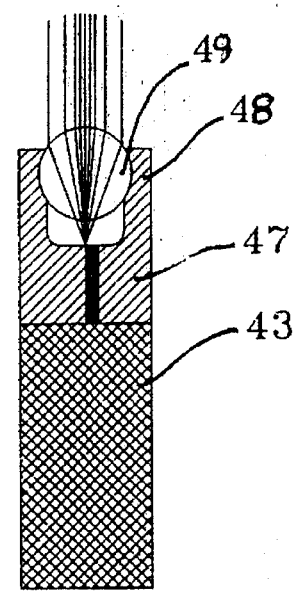

FIGS. 11–13 each show an individual laser diode bar 25 mounted in a flat conductor, direct bonded on a flat dielectric substrate or block 43. In FIG. 11, the conductor layer 44 and the laser diode bar 25 have a common planar surface. In FIG. 12, the conductor layer 45 is configured with extended side tabs 46 to prevent the laser diode 25 from contact with other objects which may damage or contaminate its emitting surface. In FIG. 13, the conductor layer 47 is configured with extended side tabs 48 supporting a collimating lens 49 to collimate the emission from the laser diode 25.

In all of the above described devices, the conductors are preferably copper because of its thermal and electrical conductivity, and because of the direct bond advantage described above. The block or substrate is preferably beryllium oxide because it is a thermally conductive dielectric, but some other ceramic or oxide such as alumina might be used, particularly in the embodiment of FIG. 6–9 where thermal conductivity of the block is not important.

The foregoing description of preferred embodiments of this invention, including any dimensions, angles, or proportions, is intended as illustrative. The concept and scope of the invention are limited only by the following claims and equivalents thereof.

What is claimed is:

1. A laser diode device, including:

a block of dielectric material defining a cylindrical cavity;

a segmented copper ring disposed within said cylindrical cavity and direct bonded to said block;

said copper ring comprising a plurality of separate ring segments, adjacent ring segments and the block bonded thereto defining radial diode bar spaces each having an expanded opening at the radial outer end thereof, and a laser diode bar disposed in each of said bar spaces to form a cylindrical array of said laser diode bars:

said ring segments and said laser diode bars together forming a series path for electric current around said ring in which each of said laser diode bars carries substantially all of said current;

wherein said electric current around said copper ring energizes said laser diode bars.

2. A laser device as defined in claim 1, wherein said dielectric material is beryllium oxide.

3. A laser diode device, including:

a first block of dielectric material including a semi-cylindrical cavity lined with a semi-cylindrical conductor direct bonded to said first block;

a second block of dielectric material including a semi-cylindrical cavity lined with a semi-cylindrical conductor direct boned to said second block;

said semi-cylindrical conductors joined together to form a conductor ring;

said conductor ring comprising a plurality of separate ring segments, adjacent ring segments and the block bonded thereto defining radial diode bar spaces each having an expanded opening at the radial outer end thereof; and a laser diode bar disposed in each of said bar spaces to form a cylindrical array of said laser diode bars;

said ring segments and said laser diode bars together forming a series path for electric current around said ring in which each of said laser diode bars carries substantially all of said current;

wherein said electric current around said conductor ring energizes said laser diode bars.

4. A laser device as defined in claim 3, wherein said dielectric material is beryllium oxide.

5. A laser device as defined in claim 3, each said semi-cylindrical conductor including a central half ring spaced radially inward from its block by a plurality of radial webs defining coolant flow channels around said central half ring.

6. A laser diode device, including:

a first block of dielectric material defining a first semi-cylindrical cavity;

a first semi-cylindrical half of a copper ring disposed within said first semi-cylindrical cavity and direct bonded to said first block;

a second block of dielectric material defining a second semi-cylindrical cavity;

a second semi-cylindrical half of a copper ring disposed within said second semi-cylindrical cavity and direct bonded to said second block;

said first and second halves joined together to form a copper ring;

said copper ring comprising a plurality of separate ring segments, adjacent ring segments and the block bonded thereto defining radial diode bar spaces each having an expanded opening at the radial outer end thereof, and a laser diode bar disposed in each of said bar spaces to form a cylindrical array of said laser diode bars;

said ring segments and said laser diode bars together forming a series path for electric current around said ring in which each of said laser diode bars carries substantially all of said current;

wherein said electric current around said copper ring energizes said laser diode bars.

7. A laser device as defined in claim 6, wherein said dielectric material is beryllium oxide.

8. A laser diode device, including:

a first block of dielectric material defining a first semi-cylindrical cavity;

a first semi-cylindrical conductor member disposed within said first semi-cylindrical cavity and direct bonded to said first block, said first conductor member including a first central half ring spaced radially inward from said first block by a plurality of radial webs defining a plurality of coolant flow channels around said first central half ring;

a second block of dielectric material defining a second semi-cylindrical cavity;

a second semi-cylindrical conductor member disposed within said second semi-cylindrical cavity and direct bonded to said second block, said second conductor member including a second central half ring spaced radially inward from said second block by a plurality of radial webs forming a plurality of coolant flow channels around said second central half ring;

said first and second half rings joined together to form a copper ring;

said copper ring comprising a plurality of separate ring segments defining radial diode bar spaces therebetween; and a laser diode bar disposed in each of said bar spaces to form a cylindrical array of said laser diode bars;

said ring segments and said laser diode bars together forming a series path for electric current around said ring in which each of said laser diode bars carries substantially all of said current;

wherein said electric current around said copper ring energizes said laser diode bars.

9. A laser device as defined in claim 8, wherein said dielectric material is beryllium oxide.

10. A laser diode device, including:

a plurality of blocks of dielectric material each defining part of a cylindrical cavity;

each said part lined with a partial cylindrical copper conductor direct bonded thereto;

said blocks and said partial cylindrical conductors joined together to form a conductor ring;

said conductor ring comprising a plurality of separate ring segments, adjacent ring segments and the block bonded thereto defining radial diode bar spaces each having an expanded opening at the radial outer end thereof, and a laser diode bar disposed in each of said bar spaces to form a cylindrical array of said laser diode bars;

said ring segments and said laser diode bars together forming a series path for electric current around said ring in which each of said laser diode bars carries substantially all of said current;

wherein said electric current around said conductor ring energizes said laser diode bars.

* * * * *